United States Patent
Madsen et al.

(10) Patent No.: US 10,266,947 B2
(45) Date of Patent: Apr. 23, 2019

(54) ROTARY FRICTION WELDED BLANK FOR PECVD HEATED SHOWERHEAD

(71) Applicant: LAM RESEARCH CORPORATION, Fremont, CA (US)

(72) Inventors: Eric Madsen, Sherwood, OR (US); Kurt Kern, San Jose, CA (US)

(73) Assignee: LAM RESEARCH CORPORATION, Fremont, CA (US)

(*) Notice: Subject to any disclaimer, the term of this patent is extended or adjusted under 35 U.S.C. 154(b) by 95 days.

(21) Appl. No.: 15/244,635

(22) Filed: Aug. 23, 2016

(65) Prior Publication Data
US 2018/0057940 A1   Mar. 1, 2018

(51) Int. Cl.
| | |
|---|---|
| *B23K 20/12* | (2006.01) |
| *C23C 16/455* | (2006.01) |
| *B23K 20/24* | (2006.01) |
| *C23C 16/505* | (2006.01) |

(52) U.S. Cl.
CPC .... *C23C 16/45565* (2013.01); *B23K 20/1205* (2013.01); *B23K 20/129* (2013.01); *B23K 20/24* (2013.01); *C23C 16/505* (2013.01)

(58) Field of Classification Search
CPC ............ C23C 16/45565; C23C 16/505; B23K 20/1205; B23K 20/24; B23K 20/129; B23K 20/122–20/1215; B21D 51/16
USPC .............................. 228/112.1–114.5, 2.1–2.3
See application file for complete search history.

(56) References Cited

U.S. PATENT DOCUMENTS

| | | | | |
|---|---|---|---|---|
| 3,699,639 A | * | 10/1972 | Ditto | B23K 20/1205 156/73.5 |
| 3,777,360 A | * | 12/1973 | Welch | B23K 20/129 228/114.5 |
| 3,824,663 A | * | 7/1974 | Sohn | B23K 20/129 228/114.5 |
| 4,087,038 A | * | 5/1978 | Yagi | B23K 20/129 228/114.5 |
| 4,119,261 A | * | 10/1978 | Devine, Jr. | B23K 20/12 228/113 |
| 5,294,054 A | * | 3/1994 | Benedict | B05B 1/1645 239/222.15 |
| 5,567,483 A | * | 10/1996 | Foster | H01L 21/321 257/E21.3 |
| 5,610,106 A | * | 3/1997 | Foster | C23C 16/34 257/E21.582 |
| 6,105,849 A | * | 8/2000 | Mochizuki | B23K 20/12 228/102 |

(Continued)

FOREIGN PATENT DOCUMENTS

| | | | | |
|---|---|---|---|---|
| CA | 2921124 A1 | * | 8/2017 | ............. B23K 20/12 |
| DE | 4116139 A1 | * | 11/1992 | ........... B23K 20/129 |

(Continued)

*Primary Examiner* — Kiley S Stoner
(74) *Attorney, Agent, or Firm* — Buchanan Ingersoll & Rooney LLP (57) ABSTRACT

A deposition apparatus for processing substrates includes a vacuum chamber including a processing zone in which a substrate may be processed. A showerhead assembly includes a stem, face plate and back plate wherein the stem is rotary friction welded to the back plate. A substrate pedestal assembly is configured to support a substrate on an upper surface thereof when a substrate is processed in the deposition apparatus.

11 Claims, 5 Drawing Sheets

(56) References Cited

U.S. PATENT DOCUMENTS

| | | | |
|---|---|---|---|
| 6,244,496 B1 * | 6/2001 | Kato | B23K 20/129 228/112.1 |
| 6,659,331 B2 | 12/2003 | Thach et al. | |
| 7,055,732 B2 | 6/2006 | Thach et al. | |
| 8,047,740 B2 * | 11/2011 | Christ | B21J 5/066 403/270 |
| 2001/0040179 A1 * | 11/2001 | Tochigi | B23K 20/126 228/2.1 |
| 2004/0060966 A1 * | 4/2004 | Stotler | B23K 20/1285 228/113 |
| 2008/0023527 A1 | 1/2008 | Brenninger et al. | |
| 2009/0108050 A1 * | 4/2009 | Nagano | B23K 20/1235 228/112.1 |
| 2009/0324986 A1 * | 12/2009 | Kleber | B23K 20/12 428/591 |
| 2010/0040900 A1 * | 2/2010 | Sumi | B23K 20/121 428/586 |
| 2011/0287632 A1 | 11/2011 | Brown et al. | |
| 2011/0304086 A1 | 12/2011 | Liu et al. | |
| 2013/0248053 A1 | 9/2013 | Bordesoules-Eberl et al. | |
| 2014/0051254 A1 | 2/2014 | Brown et al. | |
| 2014/0217193 A1 | 8/2014 | Breiling et al. | |
| 2014/0242410 A1 | 8/2014 | Kim | |
| 2015/0167168 A1 | 6/2015 | Keshavamurthy et al. | |
| 2015/0218701 A1 | 8/2015 | Bartlett et al. | |
| 2015/0225854 A1 | 8/2015 | Madsen | |
| 2016/0203953 A1 | 7/2016 | Lesser et al. | |
| 2016/0265473 A1 * | 9/2016 | Jiang | B23K 20/12 |
| 2017/0301515 A1 * | 10/2017 | Madsen | C23C 16/45591 |

FOREIGN PATENT DOCUMENTS

| | | | | |
|---|---|---|---|---|
| GB | 1393736 A | * | 5/1975 | B23K 20/129 |
| KR | 20120022348 A | * | 3/2012 | |
| WO | WO-9532833 A1 | * | 12/1995 | B23K 20/129 |

* cited by examiner

ROTARY FRICTION WELDED BLANK FOR PECVD HEATED SHOWERHEAD

FIELD OF THE INVENTION

This invention pertains to substrate processing apparatuses for processing substrates, and may find particular use in plasma-enhanced chemical vapor depositions processing apparatuses operable to deposit thin films.

BACKGROUND

Substrate processing apparatuses are used to process substrates, such as semiconductor, glass, or polymer substrates, by techniques including etching, physical vapor deposition (PVD), chemical vapor deposition (CVD), plasma-enhanced chemical vapor deposition (PECVD), atomic layer deposition (ALD), plasma-enhanced atomic layer deposition (PEALD), pulsed deposition layer (PDL), plasma-enhanced pulsed deposition layer (PEPDL), and resist removal. One type of substrate processing apparatus is a plasma processing apparatus that includes a reaction chamber containing upper and lower electrodes wherein a radio frequency (RF) power is applied between the electrodes to excite a process gas into plasma for processing substrates in the reaction chamber.

SUMMARY

Disclosed herein is a blank for a plasma enhanced chemical vapor deposition (PECVD) heated showerhead comprising a stem, back plate and face plate, the blank comprising a stem precursor blank and a back plate precursor blank joined by rotary friction welding.

The stem precursor blank can comprise a round bar of aluminum material having a length of at least about 6 inches and diameter of at least about 3 inches and the back plate precursor blank can comprise a circular plate of aluminum material having a thickness of at least about 1 inch and diameter of at least about 13 inches, the axial end of the stem precursor blank rotary friction welded to the center of one side of the back plate precursor blank.

The back plate precursor blank preferably comprises a rolled plate of an aluminum alloy and the stem precursor blank preferably comprises an extruded bar of an aluminum alloy such as aluminum alloy 6061.

Also disclosed herein is a showerhead assembly comprising a face plate and the blank described above, wherein the blank has been machined to remove weld flash around the weld interface, the stem precursor blank has been machined to desired dimensions of a stem, the back plate precursor blank has been machined to desired dimensions of a back plate, the face plate has been attached to the back plate with a plenum between an inner surface of the face plate and an inner surface of the back plate, and at least one gas passage extending axially through the stem and back plate is in fluid communication with the plenum. The face plate can include a plurality of posts extending vertically upwardly from the inner surface and upper ends of the posts can be located in corresponding openings of the back plate in which upper ends of the posts are located. For example, upper ends of the posts can be welded in recesses of the back plate. The face plate can include a lower wall and an outer wall extending vertically upwardly from an outer periphery of the lower wall and an upper end of the outer wall can be sealed via welding or other suitable technique to an outer periphery of the back plate.

The blank described above can be made by cutting a length of extruded billet to provide a stem precursor blank, cutting a piece of plate stock to provide a back plate precursor blank, forming a welded blank by rotary friction welding the stem precursor blank to the back plate precursor blank, and forming a showerhead component blank having an integral stem and back plate by machining the welded blank to remove welding flash. The method can further include machining the back plate precursor blank to include a raised hub on one side thereof, machining the stem precursor blank to have an axial end perpendicular to a center axis of the stem precursor blank, clamping the back plate precursor blank with the raised hub exposed, rotating the stem precursor blank while pressing the axial end of the stem precursor blank against the raised hub so as to form a fusion weld joint between opposed surfaces of the stem precursor blank and the back plate precursor blank. The method can include one or more of (a) machining the welded blank to final desired dimensions of a back plate and stem of a chandelier showerhead assembly and welding an outer periphery of the back plate to an outer wall of a face plate such that an inner plenum is formed between the back plate and the face plate; (b) machining at least one vertically extending gas passage in the stem and back plate such that the gas passage is in fluid communication with the inner plenum; (c) inserting posts extending from an inner surface of the face plate into holes in the back plate and welding upper ends of posts to the back plate; (d) selecting aluminum material such that the back plate precursor blank and the stem precursor blank are made of an aluminum alloy having the same composition; (e) carrying out the rotary friction welding with an axial pressure of at least 3000 psi while rotating the stem precursor blank at a rotational speed of at least 300 rpm; (f) joining the parts such that the weld area is at least 30 square inches; and (g) heat treating the welded blank such that grain size of the weld zone is generally uniform.

DETAILED DESCRIPTION

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, well-known processes, procedures, and/or components have not been described in detail so as not to unnecessarily obscure aspects of embodiments disclosed herein. Like numerals in the figures indicate like elements. As used herein the term "about" refers to ±10%.

Disclosed herein is a showerhead assembly which includes a stem and back plate joined by friction welding. Rotary friction welding is a solid-state welding process wherein heat for welding is produced by relative motion between two interfaces and a joint is produced without melting at the interface. In joining an aluminum backing plate to an aluminum stem, a stationary backing plate can be held in contact with a rotating stem under constant or gradually increasing pressure until the interface reaches the welding temperature. The rotational speed, axial pressure and welding time can be controlled to achieve atomic diffusion until a metallurgical bond is formed at the interface of the two parts. The friction weld is highly advantageous in that thermal conduction between the aluminum backing plate and aluminum stem can be equivalent to a single piece of aluminum material machined to have a backing plate at one end of a stem. The stem and backing plate are preferably made of an aluminum alloy 6061 with the stem comprising an extruded bar of suitable diameter and the backing plate of rolled plate stock.

Figure 1:
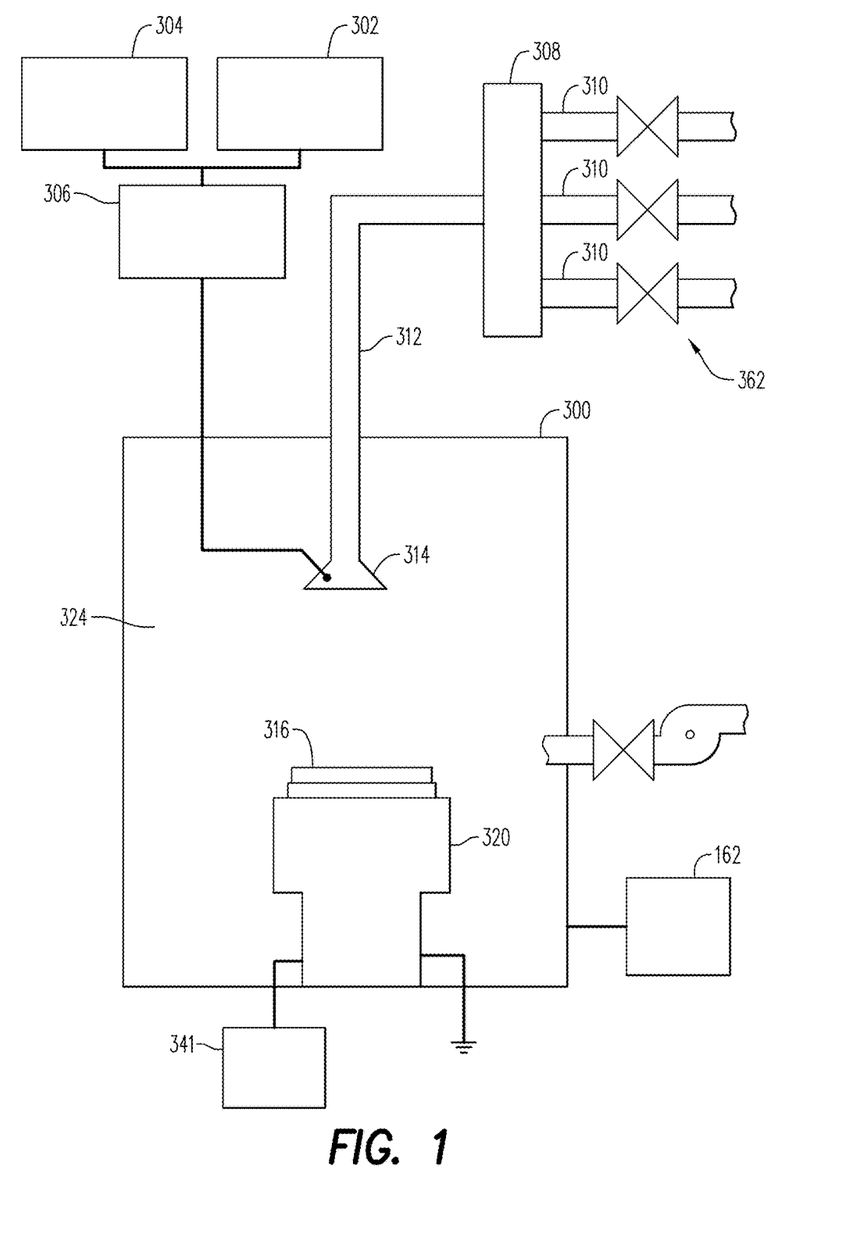
FIG. 1 illustrates a schematic diagram showing an overview of a deposition apparatus.

The showerhead assembly disclosed herein is useful in a deposition apparatus such as a plasma-enhanced chemical deposition apparatus (i.e. PECVD apparatus, PEALD apparatus, or PEPDL apparatus), however, they are not so limited. FIG. 1 provides a simple block diagram depicting various substrate plasma processing apparatus components arranged for implementing embodiments as disclosed herein. As shown, a substrate plasma processing apparatus 300 includes a vacuum chamber 324 that serves to contain plasma in a processing zone, which is generated by a capacitor type system including a showerhead assembly 314 having an upper RF electrode (not shown) therein working in conjunction with a substrate pedestal assembly 320 having a lower RF electrode (not shown) therein. At least one RF generator is operable to supply RF energy into a processing zone above an upper surface of a substrate 316 in the vacuum chamber 324 to energize gas supplied into the processing zone of the vacuum chamber 324 into plasma such that a plasma deposition process may be performed in the vacuum chamber 324. For example, a high-frequency RF generator 302 and a low-frequency RF generator 304 may each be connected to a matching network 306, which is connected to the upper RF electrode of the showerhead assembly 314 such that RF energy may be supplied to the processing zone above the substrate 316 in the vacuum chamber 324.

The power and frequency of RF energy supplied by matching network 306 to the interior of the vacuum chamber 324 is sufficient to generate plasma from the gas. In an embodiment both the high-frequency RF generator 302 and the low-frequency RF generator 304 are used, and in an alternate embodiment, just the high-frequency RF generator 302 is used. In a process, the high-frequency RF generator 302 may be operated at frequencies of about 2-100 MHz; in a preferred embodiment at 13.56 MHz or 27 MHz. The low-frequency RF generator 304 may be operated at about 50 kHz to 2 MHz; in a preferred embodiment at about 350 to 600 kHz. The process parameters may be scaled based on the chamber volume, substrate size, and other factors. Similarly, the flow rates of gas, may depend on the free volume of the vacuum chamber or processing zone.

An upper surface of the substrate pedestal assembly 320 supports a substrate 316 during processing within the vacuum chamber 324. The substrate pedestal assembly 320 can include a chuck to hold the substrate and/or lift pins to raise and lower the substrate before, during and/or after the deposition and/or plasma treatment processes. In an alternate embodiment, the substrate pedestal assembly 320 can include a carrier ring to raise and lower the substrate before, during and/or after the deposition and/or plasma treatment processes. The chuck may be an electrostatic chuck, a mechanical chuck, or various other types of chuck as are available for use in the industry and/or research. Details of a lift pin assembly for a substrate pedestal assembly including an electrostatic chuck can be found in commonly-assigned U.S. Pat. No. 8,840,754, which is incorporated herein by reference in its entirety. Details of a carrier ring for a substrate pedestal assembly can be found in commonly-assigned U.S. Pat. No. 6,860,965, which is incorporated herein by reference in its entirety. A backside gas supply 341 is operable to supply a heat transfer gas or purge gas through the substrate pedestal assembly 320 to a region below a lower surface of the substrate during processing. The substrate pedestal assembly 320 can include a lower RF electrode therein wherein the lower RF electrode is preferably grounded during processing, however in an alternate embodiment, the lower RF electrode may be supplied with RF energy during processing.

To process a substrate in the vacuum chamber 324 of the substrate plasma processing apparatus 300, gases are introduced from a gas source 362 into the vacuum chamber 324 via inlet 312 and showerhead assembly 314 wherein the gas is formed into plasma with RF energy such that a film may be deposited onto the upper surface of the substrate. In an embodiment, the gas source 362 can include multiple gas lines 310 that are connected to a heated manifold 308. The gases may be premixed or supplied separately to the chamber. Appropriate valving and mass flow control mechanisms are employed to ensure that the correct gases are delivered through the showerhead assembly 314 during substrate processing. During the processing, a backside heat transfer gas or purge gas is supplied to a region below a lower surface of the substrate supported on the substrate pedestal assembly 320. Preferably, the processing is at least one of chemical vapor deposition processing, plasma-enhanced chemical vapor deposition processing, atomic layer deposition processing, plasma-enhanced atomic layer deposition processing, pulsed deposition layer processing, or plasma-enhanced pulsed deposition layer processing.

In certain embodiments, a system controller 162 is employed to control process conditions during deposition, post deposition treatments, and/or other process operations. The controller 162 will typically include one or more memory devices and one or more processors. The processor may include a CPU or computer, analog and/or digital input/output connections, stepper motor controller boards, etc.

In certain embodiments, the controller 162 controls all of the activities of the apparatus. The system controller 162 executes system control software including sets of instructions for controlling the timing of the processing operations, frequency and power of operations of the low-frequency RF generator 304 and the high-frequency RF generator 302, flow rates and temperatures of precursors and inert gases and their relative mixing, temperature of a substrate 316 supported on an upper surface of the substrate pedestal assembly 320 and a plasma exposed surface of the showerhead assembly 314, pressure of the vacuum chamber 324, and other parameters of a particular process. Other computer programs stored on memory devices associated with the controller may be employed in some embodiments.

Typically there will be a user interface associated with controller 162. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the substrate, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the vacuum chamber 324.

Figure 2:
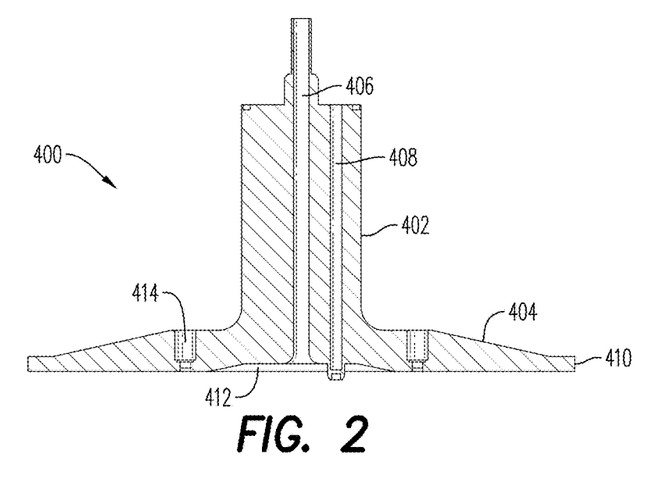
FIG. 2 illustrates an embodiment of a rotary friction welded back plate and stem of a showerhead assembly of a deposition apparatus.
Figure 3:
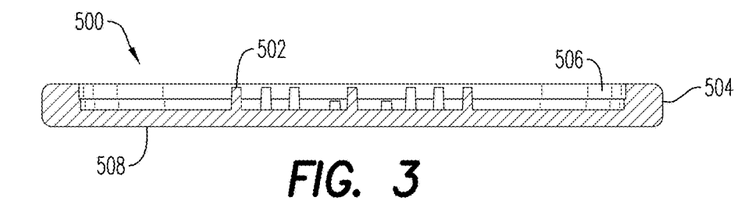
FIG. 3 illustrates a face plate of a showerhead assembly of a deposition apparatus.
Figure 4:
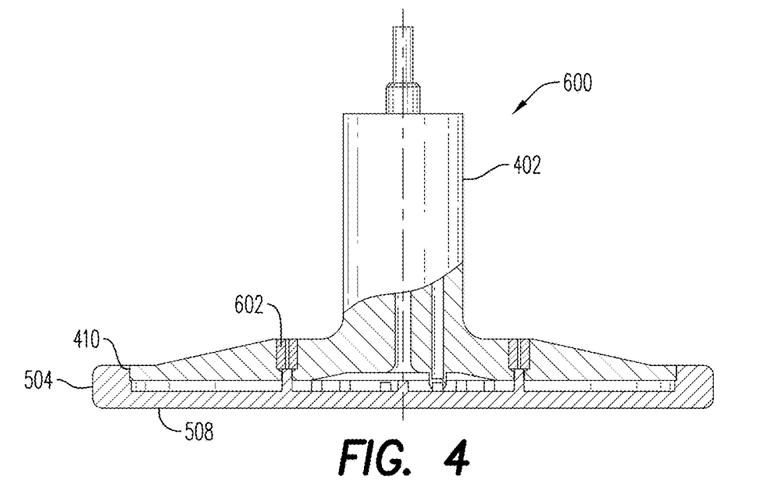
FIG. 4 illustrates a showerhead assembly of a deposition apparatus.

FIG. 2 illustrates a cross section of a rotary friction welded back plate and stem assembly 400 which has been machined to final dimensions, FIG. 3 illustrates a face plate 500 which can be attached to the welded back plate and stem assembly 400, and FIG. 4 illustrates a showerhead assembly 600 of the face plate 500 and welded back plate and stem assembly 400. As shown in FIG. 2, the back plate and stem assembly 400 includes a stem 402 and back plate 404, the stem including a central vertically extending gas passage 406 and offset vertical passage 408 for receipt of a thermocouple which monitors temperature of the face plate 500. The back plate 404 includes an outer periphery 410, a plenum 412 in fluid communication with the gas passage 406, and recesses 414 for receipt of fasteners or weld material to attach the back plate 404 to the face plate 500. As shown in FIG. 3, the face plate 500 includes standoffs 502 which are received in the recesses 414 of the back plate 404, and outer wall 504 having an inner step 506 which supports the outer periphery 410 of the back plate 404, and a lower wall 508 having gas outlets therein. As shown in FIG. 4 which illustrates the showerhead assembly 600, the recesses 414 can include weld material or fasteners 602 to attach the back plate 404 to the standoffs 502 of the face plate 500 and the outer periphery 410 of the back plate 404 can be welded to the outer wall 504 at the location of the step 506.

Figure 5A:
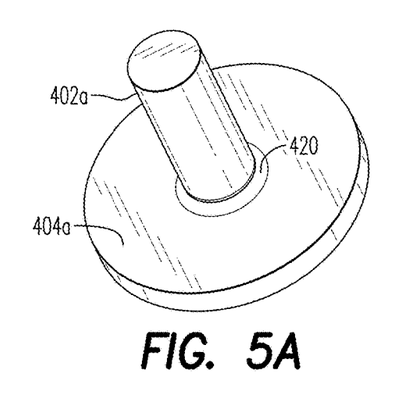
FIG. 5A illustrates a perspective view of a rotary friction welded back plate precursor material and stem precursor material of a showerhead assembly of a deposition apparatus.
Figure 5B:
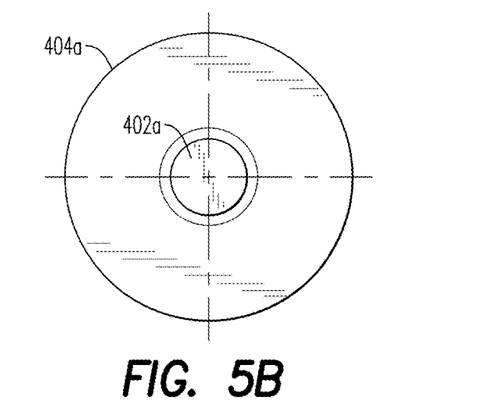
FIG. 5B is a top view of FIG. 5A
Figure 5C:
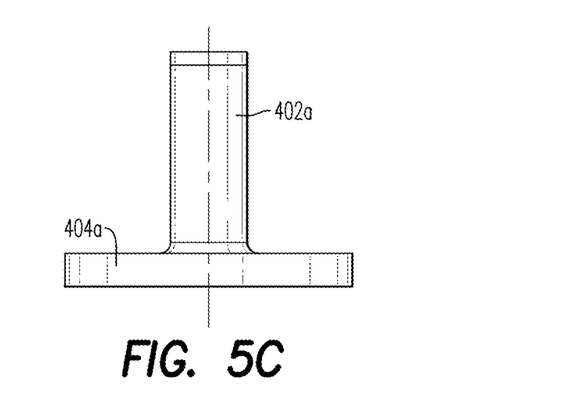
FIG. 5C is a side view of FIG. 5A.

FIG. 5A illustrates the rotary friction welded assembly 400 of FIG. 2 after friction welding and prior to final machining of the stem 402 and back plate 404. As shown, stem precursor material 402a and back plate precursor material 404a are joined at fusion weld 420, FIG. 5B shows a top view of FIG. 5A and FIG. 5C shows a side view of FIG. 5A. The stem precursor material 402a is preferably extruded aluminum bar stock such as aluminum alloy 6061 and the back plate precursor material is preferably rolled plate stock of aluminum alloy 6061. To provide enough material to be machined to final dimensions, the back plate precursor blank has a diameter of at least 12 inches and a thickness of at least 1 inch, and the stem precursor blank has a diameter of at least 2 inches and a length of at least 6 inches.

Figure 6A:
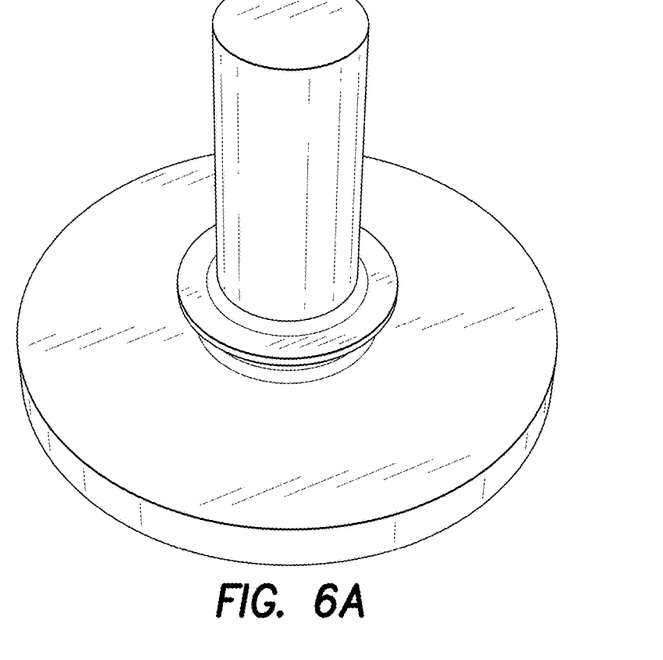
FIG. 6A is a photograph of a rotary friction welded rolled aluminum back plate precursor material and extruded aluminum stem precursor material and FIG. 6B is a photograph of a portion of the welded assembly of FIG. 6A taken at the weld fusion line.
Figure 6B:
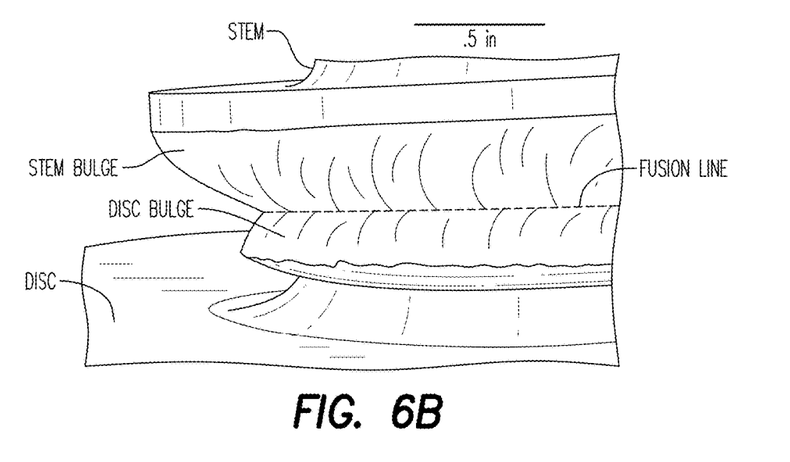
Figure 7A:
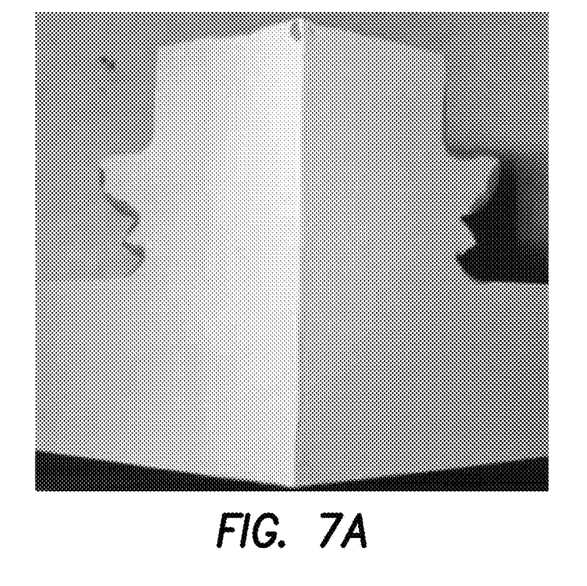
FIG. 7A is a photograph of a welded assembly as in FIG. 6A after being sectioned into a quadrant having two vertical faces passing through a weld fusion line and meeting at a center axis of the stem precursor material.
Figure 7B:
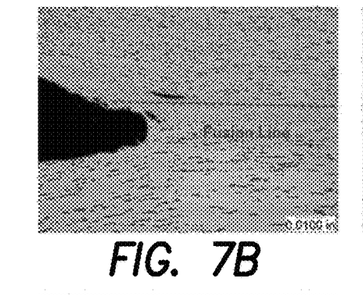
FIG. 7B is a photomicrograph of Sample 1 taken along the weld fusion line at an outer boundary of the weld joint.
Figure 7C:
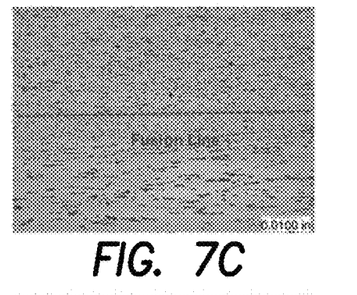
FIG. 7C is a photomicrograph of sample 1 taken along the weld fusion line at mid-radius of the stem precursor material.
Figure 7D:
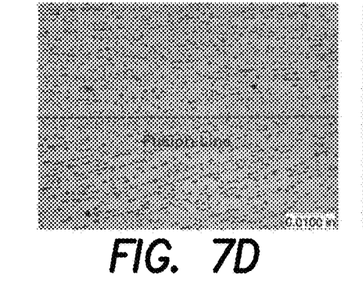
FIG. 7D is a photomicrograph of Sample 2 taken along the weld fusion line at mid-radius of the stem precursor material.
Figure 7E:
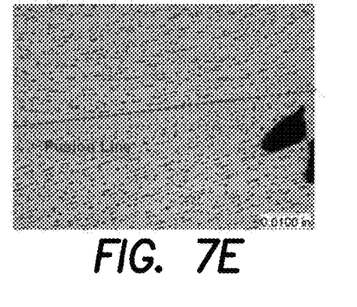
FIG. 7E is a photomicrograph of Sample 2 taken along the weld fusion line at an outer boundary of the weld joint.

FIG. 6A is a photograph of a welded assembly of a back plate precursor blank rotary friction welded to a stem precursor blank and FIG. 6B is a photograph taken at the fusion line of the welded assembly. FIG. 7A is a photograph of a welded assembly which has been sectioned through the center of the stem precursor and back plate precursor blanks and it can be seen how the weld flash expanded radially outward of the fusion weld line. FIG. 7B is a photomicrograph of Sample 1 taken along the weld fusion line at an outer boundary of the weld joint, FIG. 7C is a photomicrograph of sample 1 taken along the weld fusion line at mid-radius of the stem precursor material, FIG. 7D is a photomicrograph of Sample 2 taken along the weld fusion line at mid-radius of the stem precursor material, and FIG. 7E is a photomicrograph of Sample 2 taken along the weld fusion line at an outer boundary of the weld joint. As can be seen in FIGS. 7B-E, the welded aluminum alloy material along the fusion line is void free and includes a fine dispersion of intermetallic phases elongated in a radially outward direction.

The back plate precursor blank is preferably machined to include a raised hub at the center thereof. For example, the raised hub can be about 0.5 inch above one major face of the plate. In friction welding the stem precursor blank to the back plate precursor blank, the back plate blank is preferably held in a fixed position while the stem blank is rotated and pressed axially against the stationary back plate blank. As a result of the rotary friction welding process, metal at the two contacting surfaces of the stem blank and back plate blank is heated by friction between the two surfaces until plastic deformation of the heated metal occurs and the surfaces are welded together. The localized heating causes metal flow as the axial pressure is applied to the stem blank with the result that impurities such as oxides and contaminants are carried radially outward and trapped in weld flash surrounding the fusion line. Because the stem blank is a solid round bar and the back plate blank are contacted over a large surface area, the welded joint provides equivalent strength and chemical resistance to a unitary machined single large billet which after machining wastes about 90% of the original material, Use of plate stock for the back plate blank provides additional structural rigidity and thereby a stronger showerhead after final machining of the welded stem blank and back plate blank. Metallurgical sectioning of the welded joint revealed that there are no gaps in the joint and no voids along the weld seam (fusion line) boundary. The rotary friction weld is superior to other joining techniques such as brazing which produces a weaker bond and requires the addition of brazing material in the joint. The interlinked grain structure of the rotary friction weld can provide high strength and resistance to chemical attack by fluorine and other corrosive gases used in PECVD.

During rotary friction welding, the back plate blank can be held stationary in a rotary welding machine and the stem blank can be held in a rotating component of the machine which can be programmed to rotate the stem blank a predetermined rotational speed and axially advance the stem blank towards the back plate blank at a rate which produces a desired contact pressure between the two parts. For example, the rotary friction welding can be carried out at an axial pressure of at least 3000 psi while rotating the stem precursor blank at a rotational speed of at least 300 rpm. In rotary friction welding a stem blank cut from an extruded bar of aluminum alloy 6061 and a back plate blank cut from a rolled plate of aluminum alloy 6061, the grain structure of the aluminum alloy along the weld line can become elongated in a radially outward direction with intermetallic phases finely distributed in the grain structure. The friction weld thus produced provides heat conduction through the weld area close to the heat conduction properties of the rolled plate stock and the extruded bar stock.

Embodiments disclosed herein have been described with reference to preferred embodiments. However, it will be readily apparent to those skilled in the art that it is possible to embody the invention in specific forms other than as described above without departing from the spirit of the invention. The preferred embodiments are illustrative and should not be considered restrictive in any way.

What is claimed is:

1. A method of manufacturing a component of a showerhead assembly useful for depositing material on an upper surface of a substrate in a plasma enhanced chemical vapor deposition apparatus, the method comprising:
cutting a length of extruded solid aluminum bar to provide a stem precursor blank;
cutting a piece of rolled aluminum plate stock to provide a back plate precursor blank;
forming a welded blank by rotary friction welding the stem precursor blank to the back plate precursor blank such that a welded joint is formed across the stem precursor blank and intermetallic phases in the weld joint are elongated in a radially outward direction;
forming a showerhead component blank having an integral stem and back plate by machining the welded blank to remove welding flash.

2. The method of claim 1, further comprising machining the back plate precursor blank to include a raised hub on one side thereof, machining the stem precursor blank to have an axial end perpendicular to a center axis of the stem precursor blank, clamping the back plate precursor blank with the raised hub exposed, rotating the stem precursor blank while pressing the axial end of the stem precursor blank against the raised hub so as to form a fusion weld joint between opposed surfaces of the stem precursor blank and the back plate precursor blank.

3. The method of claim 1, further comprising machining the welded blank to final desired dimensions of a back plate and stem of a showerhead assembly and welding an outer periphery of the back plate to an outer wall of a face plate such that an inner plenum is formed between the back plate and the face plate.

4. The method of claim 3, wherein at least one vertically extending gas passage is machined in the stem and back plate such that the gas passage is in fluid communication with the inner plenum.

5. The method of claim 3, further comprising inserting posts extending from an inner surface of the face plate into holes in the back plate and welding upper ends of posts to the back plate.

6. The method of claim 1, wherein the back plate precursor blank and the stem precursor blank are made of an aluminum alloy having the same composition.

7. The method of claim 1, wherein the rotary friction welding is carried out with an axial pressure of at least 3000 psi while rotating the stem precursor blank at a rotational speed of at least 300 rpm.

8. The method of claim 1, wherein the weld area is at least 30 square inches.

9. The method of claim 1, wherein grain size of the weld zone is elongated in a radially outward direction with intermetallic phases distributed in the grain structure.

10. The method of claim 1, wherein the weld joint is free of voids and cracking.

11. The method of claim 1, wherein the back plate precursor blank has a diameter of at least 12 inches and a thickness of at least 1 inch, and the stem precursor blank has a diameter of at least 2 inches and a length of at least 6 inches.

* * * * *